(12) United States Patent
Cook

(10) Patent No.: US 7,393,788 B2
(45) Date of Patent: Jul. 1, 2008

(54) METHOD AND SYSTEM FOR SELECTIVELY ETCHING A DIELECTRIC MATERIAL RELATIVE TO SILICON

(76) Inventor: Julie A. Cook, 9 Jones Dr., Newburyport, MA (US) 07950

( * ) Notice: Subject to any disclaimer, the term of this patent is extended or adjusted under 35 U.S.C. 154(b) by 0 days.

(21) Appl. No.: 11/350,765

(22) Filed: Feb. 10, 2006

(65) Prior Publication Data

US 2007/0190792 A1    Aug. 16, 2007

(51) Int. Cl.
*H01L 21/302* (2006.01)
(52) U.S. Cl. .................. 438/689; 438/700; 438/734; 438/720; 438/742; 216/67; 216/75; 216/79; 257/412; 156/345.48
(58) Field of Classification Search ............ 438/689; 156/345.48; 216/67
See application file for complete search history.

(56) References Cited

U.S. PATENT DOCUMENTS

| | | | |
|---|---|---|---|
| 5,318,668 A | 6/1994 | Tamaki et al. | |
| 6,093,627 A * | 7/2000 | Sung | 438/586 |
| 6,890,863 B1 | 5/2005 | Donohoe et al. | |
| 7,008,878 B2 * | 3/2006 | Hsu et al. | 438/738 |
| 2005/0009283 A1 | 1/2005 | Chiu et al. | |
| 2006/0016559 A1 | 1/2006 | Kobayashi et al. | |
| 2006/0032585 A1* | 2/2006 | Kai et al. | 156/345.48 |
| 2007/0032081 A1 | 2/2007 | Chang et al. | |

OTHER PUBLICATIONS

W. Tsai, Journal of Vacuum Science & Technology, vol. B 14(5), Sep./Oct. 1996, pp. 3276-3282.*

* cited by examiner

*Primary Examiner*—Duy-Vu Deo
*Assistant Examiner*—Maki Angadi
(74) *Attorney, Agent, or Firm*—Oblon, Spivak, McClelland, Maier & Neustadt, P.C.

(57) ABSTRACT

A method and system for selectively and uniformly etching a dielectric layer with respect to silicon and polysilicon in a dry plasma etching system are described. The etch chemistry comprises the use of fluorohydrocarbons, such as $CH_2F_2$ and $CHF_3$. High etch selectivity and acceptable uniformity can be achieved by selecting a process condition, including the flow rate of $CH_2F_2$ and the power coupled to the dry plasma etching system, such that a proper balance of active etching radicals and polymer forming radicals are formed within the etching plasma.

23 Claims, 13 Drawing Sheets

METHOD AND SYSTEM FOR SELECTIVELY ETCHING A DIELECTRIC MATERIAL RELATIVE TO SILICON

CROSS REFERENCE TO RELATED APPLICATIONS

The present invention is related to pending U.S. patent application Ser. No. 11/226,452, entitled "METHOD AND SYSTEM FOR ETCHING SILICON OXIDE AND SILICON NITRIDE WITH HIGH SELECTIVITY RELATIVE TO SILICON" and filed on Sep. 15, 2005, the entire contents of which are herein incorporated by reference.

BACKGROUND OF THE INVENTION

1. Field of the Invention

The present invention relates to a method and system selectively etching dielectric materials, and more particularly to a method and system for uniformly etching silicon oxide ($SiO_x$) or silicon nitride ($Si_yN_z$) with high selectivity relative to silicon using a process chemistry comprising trifluoromethane ($CHF_3$) and difluoromethane ($CH_2F_2$).

2. Description of Related Art

Typically, during fabrication of integrated circuits (ICs), semiconductor production equipment utilize a (dry) plasma etch process to remove or etch material along fine lines or within vias or contacts patterned on a semiconductor substrate. The success of the plasma etch process requires that the etch chemistry includes chemical reactants suitable for selectively etching one material while substantially not etching another material. For example, on a semiconductor substrate, a pattern formed in a protective layer can be transferred to an underlying layer of a selected material utilizing a plasma etching process. The protective layer can comprise a light-sensitive layer, such as a photoresist layer, having a pattern formed using a lithographic process. Once the pattern is formed, the semiconductor substrate is disposed within a plasma processing chamber, and an etching chemistry is formed that selectively etches the underlying layer while minimally etching the protective layer. This etch chemistry is produced by introducing an ionizable, dissociative gas mixture having parent molecules comprising molecular constituents capable of reacting with the underlying layer while minimally reacting with the protective layer. The production of the etch chemistry comprises introduction of the gas mixture and formation of plasma when a portion of the gas species present are ionized following a collision with an energetic electron. Moreover, the heated electrons serve to dissociate some species of the gas mixture and create a reactive mixture of chemical constituents (of the parent molecules). Thereafter, the ionized gas species and reactive mixture of chemical constituents facilitate the etching of various features (e.g., trenches, vias, contacts, etc.) in the exposed regions of substrate. Such substrate materials where etching is required include silicon dioxide ($SiO_2$), polysilicon and silicon nitride, for example.

SUMMARY OF THE INVENTION

The present invention relates to a method for etching a substrate using a dry plasma process. In particular, the present invention relates to a method for selectively etching a silicon oxide layer or a silicon nitride layer or both relative to a silicon feature on the substrate. Additionally, the present invention relates to optimizing an etch property, such as etch selectivity or etch uniformity or both, when etching the silicon oxide layer or the silicon nitride layer.

According to an embodiment, a method of, and computer readable medium for, reducing a recess in a spacer etch process is described, comprising: disposing a silicon substrate having a spacer dielectric layer overlying a polysilicon feature on a substrate holder in a dry plasma etching system; selecting a process condition to have an etch selectivity between the spacer dielectric layer and the silicon substrate of greater than or equal to approximately 5-to-1, comprising: setting a pressure in the dry plasma etching system; introducing a process gas comprising a first flow rate of a noble gas, a second flow rate of $CHF_3$, and a third flow rate of $CH_2F_2$; and setting a power to be coupled to an electrode in the dry plasma etching system to form plasma from the process gas; applying the process condition to the dry plasma etching system; and exposing the substrate to the process condition.

According to an embodiment, a method of, and computer readable medium for, uniformly etching silicon oxide relative to silicon on a substrate placed in a dry plasma etching system is described, comprising: placing the substrate having the silicon oxide ($SiO_x$) film on a substrate holder in the dry plasma etching system; introducing a reactive process gas to a process space in the dry plasma etching system, the reactive process gas comprising $CH_2F_2$ and $CHF_3$; applying a first radio frequency (RF) signal to an electrode in the dry plasma etching system, wherein the first RF signal comprises a frequency greater than 20 MHz; selecting a ratio of a flow rate of the $CH_2F_2$ to a RF power coupled to the electrode that is substantially equal to or less than a value of 0.0071 sccm per Watt; and etching the silicon oxide film.

According to yet another embodiment, a dry plasma etching system is described, comprising a process chamber configured to define a process space; a substrate holder coupled to the process chamber and configured to support a substrate in the process space; a process gas supply system coupled to the process chamber and configured to introduce a reactive process gas to a process space in the dry plasma etching system, the reactive process gas comprising $CH_2F_2$ and $CHF_3$; a vacuum processing system coupled to the process chamber and configured to evacuate the process space; a power system coupled to an electrode in the process chamber and configured to couple radio frequency (RF) power to the process gas in order to form plasma in the process space; and a controller coupled to the process gas supply system and the power system and configured to set a ratio of a flow rate of the $CH_2F_2$ to a RF power coupled to the electrode that is substantially equal to or less than a value of 0.0071 sccm per Watt.

DETAILED DESCRIPTION OF SEVERAL EMBODIMENTS

Figure 1A:
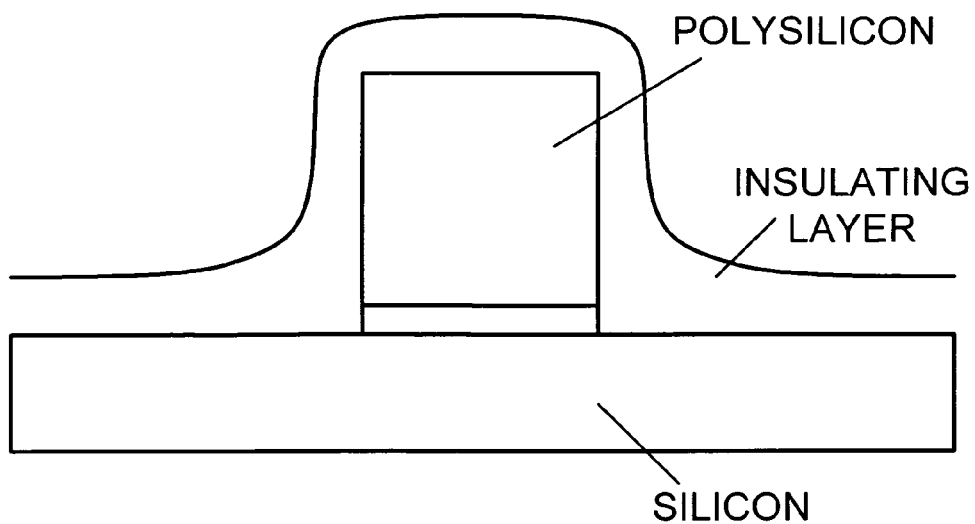
FIGS. 1A and 1B show a schematic representation of a structure formed on a silicon substrate.

In the following description, to facilitate a thorough understanding of the invention and for purposes of explanation and not limitation, specific details are set forth, such as a particular geometry of the dry plasma etching system configured to perform an etching process and various descriptions of the system components. However, it should be understood that the invention may be practiced with other embodiments that depart from these specific details.

In material processing methodologies, dry plasma etching utilizes a plasma chemistry having chemical reactants suitable for selectively etching one material while substantially not etching another material. In one example, a layer of insulating (dielectric) material is deposited over a gate stack having a polycrystalline silicon (polysilicon) feature, see FIG. 1A. For example, the insulating layer may comprise silicon dioxide (e.g., $SiO_2$), or silicon nitride (e.g., $Si_2N_3$), or both. Then, the insulating layer is subjected to an etching process, whereby the insulating layer is removed in all locations except along the sidewalls of the gate stack; see FIG. 1B. The remaining insulating material acts as a spacer in the fabrication of the semiconductor device. It is important for device operation and/or reliability that the spacer be formed without substantially reducing the polysilicon gate material and while minimizing a recess (FIG. 1B) formed in the silicon substrate. Preferably, the recess is reduced to less than 2.7 nm, more preferably less than 1 nm. Thus, an etch chemistry is preferably chosen to etch the insulating material while minimally etching the underlying (single crystal) silicon substrate, as well as minimally etching the polysilicon. Furthermore, it is important for manufacturing yields, for example, that the results of the spacer etch process are uniform across the extent of the substrate.

Accordingly, in one embodiment a method and system for selectively and uniformly etching silicon oxide ($SiO_x$) or silicon nitride ($Si_yN_z$) with respect to silicon and polysilicon in a dry plasma etching system are described. The etch chemistry comprises the use of fluorohydrocarbons, such as $CH_2F_2$ and $CHF_3$. High etch selectivity and acceptable uniformity can be achieved by selecting a process condition, including the flow rate of $CH_2F_2$ and the power coupled to the dry plasma etching system, such that a proper balance of active etching molecules or atoms, and polymer forming molecules are formed within the etching plasma.

For example, it is believed by the inventor that the use of a fluorohydrocarbon etch chemistry promotes the formation of hydrocarbon and fluorocarbon molecules in the presence of the etching plasma that may adsorb on polysilicon and silicon surfaces and protect these surfaces during the etching process, while permitting the etching of silicon oxide or silicon nitride surfaces. Although both $CHF_3$ and $CH_2F_2$ can be considered polymer forming gases (for the protection of silicon and polysilicon surfaces), under certain process conditions, to be discussed later, $CHF_3$ tends to produce actively etching molecules or atoms, and $CH_2F_2$ tends to produce polymer forming molecules.

According to one embodiment, the etch chemistry comprises trifluoromethane ($CHF_3$), difluoromethane ($CH_2F_2$), and an inert gas, such as a noble gas (e.g., argon, krypton, xenon, etc.). Additionally, the etch chemistry can further comprise an oxygen containing gas. The oxygen containing gas can comprise oxygen ($O_2$), NO, $N_2O$, $NO_2$, CO, or $CO_2$, or any combination thereof. For example, one process recipe for uniformly etching silicon oxide or silicon nitride with high selectivity to silicon comprises trifluoromethane ($CHF_3$), difluoromethane ($CH_2F_2$), and argon (Ar).

Figure 2:
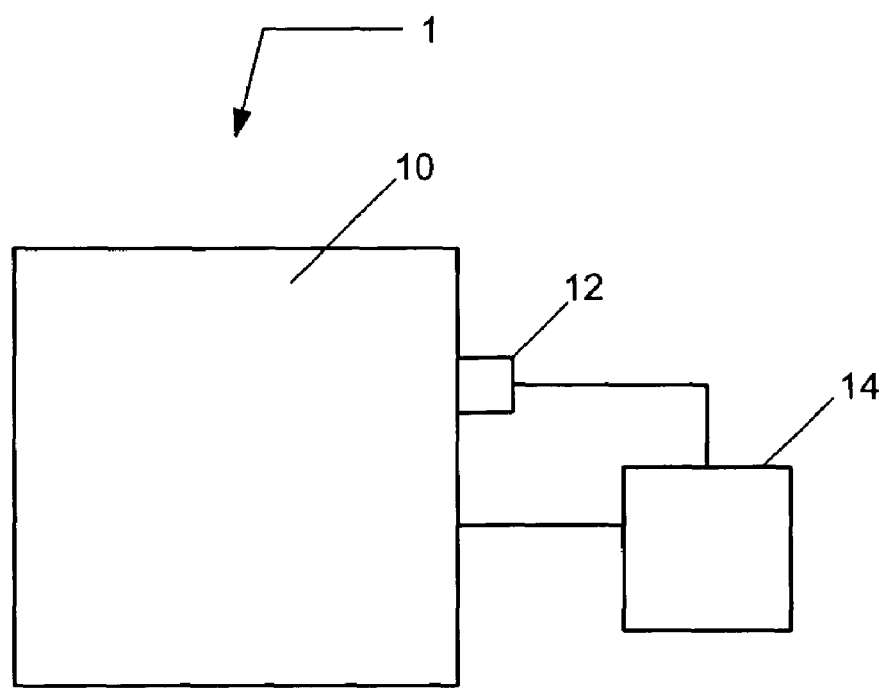
FIG. 2 shows a schematic diagram of a dry plasma etching system according to an embodiment of the present invention.

According to another embodiment, a dry plasma etching system 1 is depicted in FIG. 2 comprising a plasma processing chamber 10, a diagnostic system 12 coupled to the plasma processing chamber 10, and a controller 14 coupled to the diagnostic system 12 and the plasma processing chamber 10. The controller 14 is configured to execute a process recipe comprising trifluoromethane ($CHF_3$), difluoromethane ($CH_2F_2$), and an inert gas to selectively and uniformly etch silicon oxide or silicon nitride relative to silicon. Alternatively, the controller 14 is configured to execute a process recipe comprising trifluoromethane ($CHF_3$), difluoromethane ($CH_2F_2$), and an inert gas to selectively etch silicon oxide or silicon nitride relative to silicon and polysilicon. In one embodiment, the process recipe comprises trifluoromethane ($CHF_3$), difluoromethane ($CH_2F_2$), and argon (Ar). In another embodiment, the process recipe comprises trifluoromethane ($CHF_3$), difluoromethane ($CH_2F_2$), oxygen ($O_2$), and argon (Ar). Additionally, controller 14 is configured to receive at least one endpoint signal from the diagnostic system 12 and to post-process the at least one endpoint signal in order to accurately determine an endpoint for the process. In the illustrated embodiment, dry plasma etching system 1, depicted in FIG. 2, utilizes plasma for material processing.

Figure 3:
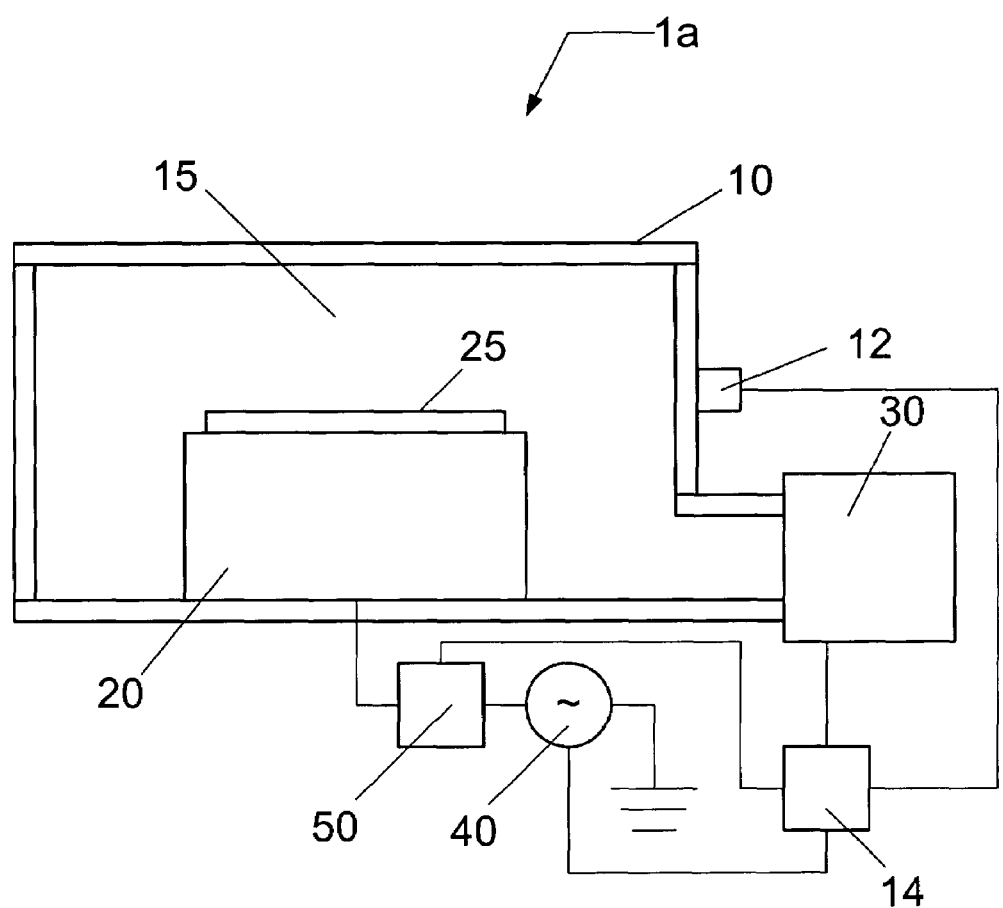
FIG. 3 shows a schematic diagram of a dry plasma etching system according to another embodiment of the present invention.

According to the embodiment depicted in FIG. 3, dry plasma etching system 1a can comprise plasma processing chamber 10, substrate holder 20, upon which a substrate 25 to be processed is affixed, and vacuum pumping system 30. Substrate 25 can be, for example, a semiconductor substrate, a wafer or a liquid crystal display. Plasma processing chamber 10 can be, for example, configured to facilitate the generation of plasma in processing region 15 adjacent a surface of substrate 25. An ionizable gas or mixture of gases is introduced via a gas injection system (not shown) and the process pressure is adjusted. For example, a control mechanism (not shown) can be used to throttle the vacuum pumping system 30. Plasma can be utilized to create materials specific to a pre-determined materials process, and/or to aid the removal of material from the exposed surfaces of substrate 25. The dry plasma etching system 1a can be configured to process 200 mm substrates, 300 mm substrates, or larger.

Substrate 25 can be, for example, affixed to the substrate holder 20 via an electrostatic clamping system. Furthermore, substrate holder 20 can, for example, further include a cooling system including a re-circulating coolant flow that receives heat from substrate holder 20 and transfers heat to a heat exchanger system (not shown), or when heating, transfers heat from the heat exchanger system. Moreover, gas can, for example, be delivered to the back-side of substrate 25 via a backside gas system to improve the gas-gap thermal conductance between substrate 25 and substrate holder 20. Such a system can be utilized when temperature control of the substrate is required at elevated or reduced temperatures. For example, the backside gas system can comprise a two-zone gas distribution system, wherein the helium gas gap pressure can be independently varied between the center and the edge of substrate 25. In other embodiments, heating/cooling elements, such as resistive heating elements, or thermo-electric heaters/coolers can be included in the substrate holder 20, as well as the chamber wall of the plasma processing chamber 10 and any other component within the dry plasma etching system 1a.

In the embodiment shown in FIG. 3, substrate holder 20 can comprise an electrode through which RF power is coupled to the processing plasma in process space 15. For example, substrate holder 20 can be electrically biased at a RF voltage via the transmission of RF power from a RF generator 40 through an impedance match network 50 to substrate holder 20. The RF bias can serve to heat electrons to form and maintain plasma. In this configuration, the system can operate as a reactive ion etch (RIE) reactor, wherein the chamber and an upper gas injection electrode serve as ground surfaces. A typical frequency for the RF bias can range from about 0.1 MHz to about 100 MHz. RF systems for plasma processing are well known to those skilled in the art.

Alternately, RF power is applied to the substrate holder electrode at multiple frequencies. Furthermore, impedance match network 50 serves to improve the transfer of RF power to plasma in plasma processing chamber 10 by reducing the reflected power. Match network topologies (e.g. L-type, π-type, T-type, etc.) and automatic control methods are well known to those skilled in the art.

Vacuum pump system 30 can, for example, include a turbo-molecular vacuum pump (TMP) capable of a pumping speed up to 5000 liters per second (and greater) and a gate valve for throttling the chamber pressure. In conventional plasma processing devices utilized for dry plasma etch, a 1000 to 3000 liter per second TMP is generally employed. TMPs are useful for low pressure processing, typically less than 50 mTorr. For high pressure processing (i.e., greater than about 100 mTorr), a mechanical booster pump and dry roughing pump can be used. Furthermore, a device for monitoring chamber pressure (not shown) can be coupled to the plasma processing chamber 10. The pressure measuring device can be, for example, a Type 628B Baratron absolute capacitance manometer commercially available from MKS Instruments, Inc. (Andover, Mass.).

Controller 14 comprises a microprocessor, memory, and a digital I/O port capable of generating control voltages sufficient to communicate and activate inputs to dry plasma etching system 1a as well as monitor outputs from dry plasma etching system 1a. Moreover, controller 14 can be coupled to and can exchange information with RF generator 40, impedance match network 50, the gas injection system (not shown), vacuum pump system 30, as well as the backside gas delivery system (not shown), the substrate/substrate holder temperature measurement system (not shown), and/or the electrostatic clamping system (not shown). For example, a program stored in the memory can be utilized to activate the inputs to the aforementioned components of plasma processing system 1a according to a process recipe in order to perform the method of etching a silicon oxide layer or a silicon nitride layer. One example of controller 14 is a DELL PRECISION WORKSTATION 610™, available from Dell Corporation, Austin, Tex.

However, the controller 14 may be implemented as a general purpose computer system that performs a portion or all of the microprocessor based processing steps of the invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The controller 14 includes at least one computer readable medium or memory, such as the controller memory, for holding instructions programmed according to the teachings of the invention and for containing data structures, tables, records, or other data that may be necessary to implement the present invention. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave (described below), or any other medium from which a computer can read.

Stored on any one or on a combination of computer readable media, the present invention includes software for controlling the controller 14, for driving a device or devices for implementing the invention, and/or for enabling the controller to interact with a human user. Such software may include, but is not limited to, device drivers, operating systems, development tools, and applications software. Such computer readable media further includes the computer program product of the present invention for performing all or a portion (if processing is distributed) of the processing performed in implementing the invention.

The computer code devices of the present invention may be any interpretable or executable code mechanism, including but not limited to scripts, interpretable programs, dynamic link libraries (DLLs), Java classes, and complete executable programs. Moreover, parts of the processing of the present invention may be distributed for better performance, reliability, and/or cost.

The term "computer readable medium" as used herein refers to any medium that participates in providing instructions to the processor of the controller 14 for execution. A computer readable medium may take many forms, including but not limited to, non-volatile media, volatile media, and transmission media. Non-volatile media includes, for example, optical, magnetic disks, and magneto-optical disks, such as the hard disk or the removable media drive. Volatile media includes dynamic memory, such as the main memory. Moreover, various forms of computer readable media may be involved in carrying out one or more sequences of one or more instructions to processor of controller for execution. For example, the instructions may initially be carried on a magnetic disk of a remote computer. The remote computer can load the instructions for implementing all or a portion of the present invention remotely into a dynamic memory and send the instructions over a network to the controller 14.

Controller 14 may be locally located relative to the dry plasma etching system 1a, or it may be remotely located relative to the dry plasma etching processing system 1a via an internet or intranet. Thus, controller 14 can exchange data with the dry plasma etching system 1a using at least one of a direct connection, an intranet, or the internet. Controller 14 may be coupled to an intranet at a customer site (i.e., a device maker, etc.), or coupled to an intranet at a vendor site (i.e., an equipment manufacturer). Furthermore, another computer (i.e., controller, server, etc.) can access controller 14 to exchange data via at least one of a direct connection, an intranet, or the internet.

The diagnostic system 12 can include an optical diagnostic subsystem (not shown). The optical diagnostic subsystem can comprise a detector such as a (silicon) photodiode or a photomultiplier tube (PMT) for measuring the light intensity emitted from the plasma. The diagnostic system 12 can further include an optical filter such as a narrow-band interference filter. In an alternate embodiment, the diagnostic system 12 can include at least one of a line CCD (charge coupled device), a CID (charge injection device) array, and a light dispersing device such as a grating or a prism. Additionally, diagnostic system 12 can include a monochromator (e.g., grating/detector system) for measuring light at a given wavelength, or a spectrometer (e.g., with a rotating grating) for measuring the light spectrum such as, for example, the device described in U.S. Pat. No. 5,888,337, the entire content of which is incorporate herein by reference The diagnostic system 12 can include a high resolution Optical Emission Spectroscopy (OES) sensor such as from Peak Sensor Systems, or Verity Instruments, Inc. Such an OES sensor has a broad spectrum that spans the ultraviolet (UV), visible (VIS), and near infrared (NIR) light spectrums. The resolution is approximately 1.4 Angstroms, that is, the sensor is capable of collecting 5550 wavelengths from 240 to 1000 nm. For example, the OES sensor can be equipped with high sensitivity miniature fiber optic UV-VIS-NIR spectrometers which are, in turn, integrated with 2048 pixel linear CCD arrays.

The spectrometers receive light transmitted through single and bundled optical fibers, where the light output from the optical fibers is dispersed across the line CCD array using a fixed grating. Similar to the configuration described above, light emitting through an optical vacuum window is focused onto the input end of the optical fibers via a convex spherical lens. Three spectrometers, each specifically tuned for a given spectral range (UV, VIS and NIR), form a sensor for a process chamber. Each spectrometer includes an independent A/D converter. And lastly, depending upon the sensor utilization, a full emission spectrum can be recorded every 0.1 to 1.0 seconds.

Figure 4:
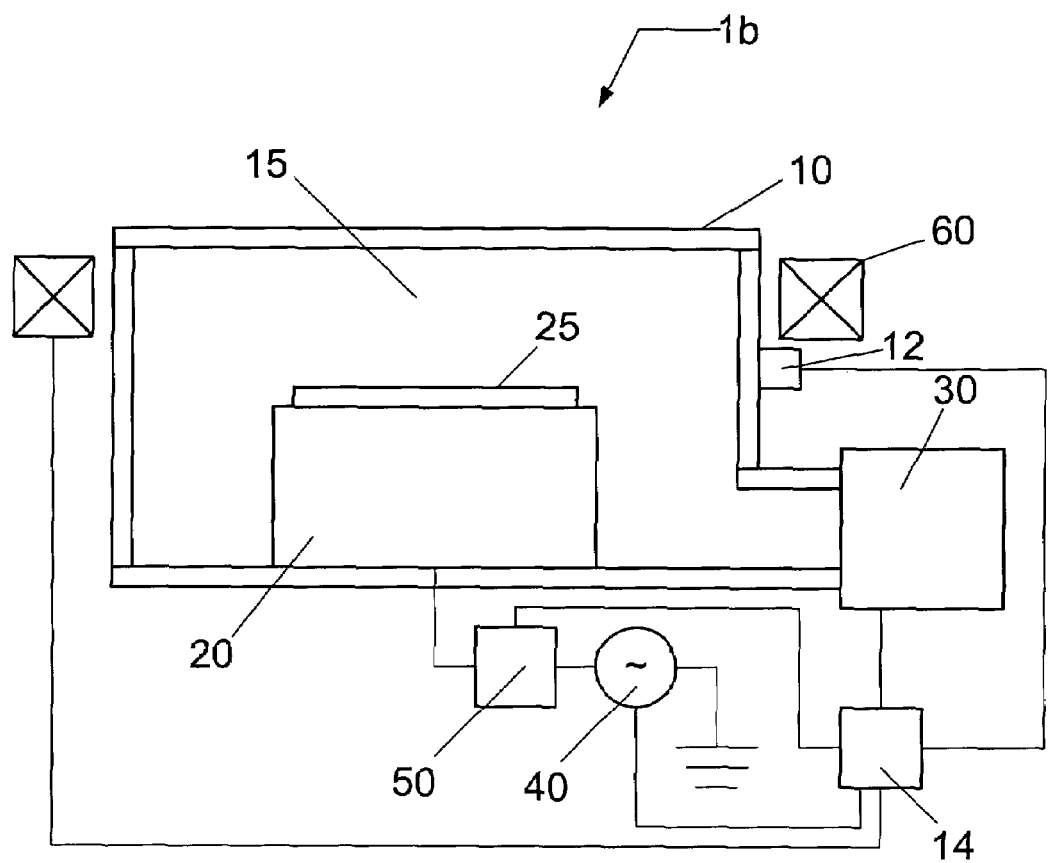
FIG. 4 shows a schematic diagram of a dry plasma etching system according to another embodiment of the present invention.

In the embodiment shown in FIG. 4, the dry plasma etching system 1b can, for example, be similar to the embodiment of FIG. 2 or 3 and further comprise either a stationary, or mechanically or electrically rotating magnetic field system 60, in order to potentially increase plasma density and/or improve plasma processing uniformity, in addition to those components described with reference to FIG. 2 and FIG. 3. Moreover, controller 14 can be coupled to magnetic field system 60 in order to regulate the speed of rotation and field strength. The design and implementation of a rotating magnetic field is well known to those skilled in the art.

Figure 5:
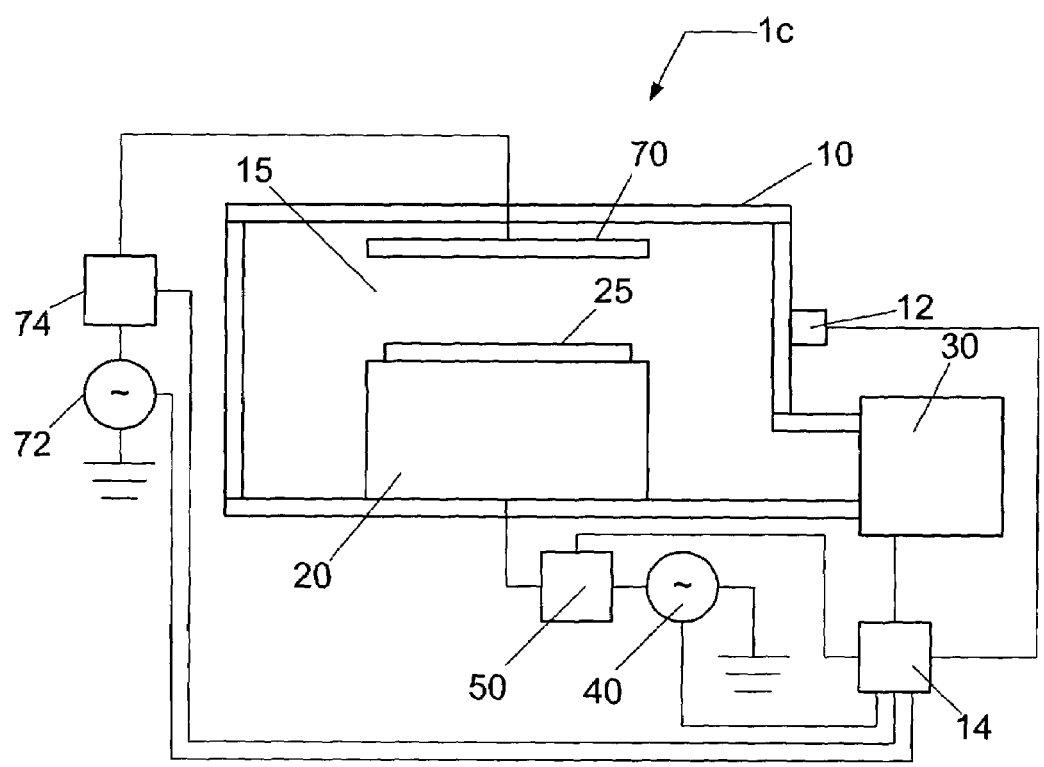
FIG. 5 shows a schematic diagram of a dry plasma etching system according to another embodiment of the present invention.

In the embodiment shown in FIG. 5, the dry plasma etching system 1c can, for example, be similar to the embodiment of FIG. 2 or FIG. 3, and can further comprise an upper electrode 70 to which RF power can be coupled from RF generator 72 through impedance match network 74. A typical frequency for the application of RF power to the upper electrode can range from about 0.1 MHz to about 200 MHz. Additionally, a typical frequency for the application of power to the lower electrode can range from about 0.1 MHz to about 100 MHz. Moreover, controller 14 is coupled to RF generator 72 and impedance match network 74 in order to control the application of RF power to upper electrode 70. The design and implementation of an upper electrode is well known to those skilled in the art.

Figure 6:
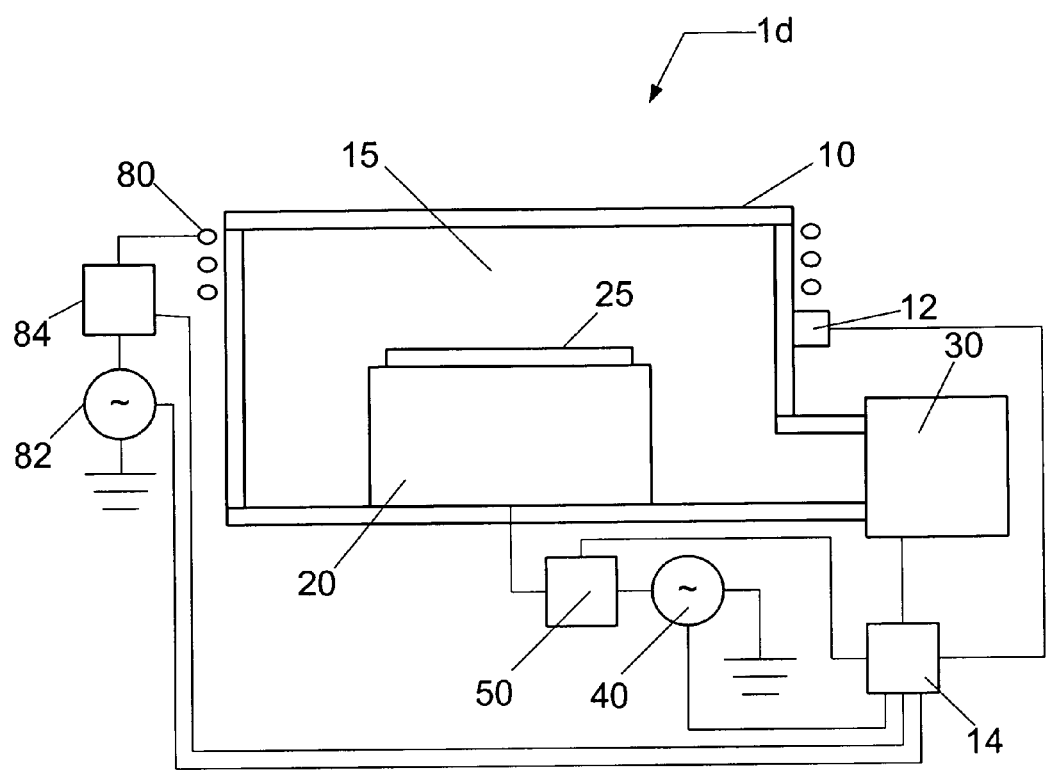
FIG. 6 shows a schematic diagram of a dry plasma etching system according to another embodiment of the present invention.

In the embodiment shown in FIG. 6, the dry plasma etching system 1d can, for example, be similar to the embodiments of FIGS. 2 and 3, and can further comprise an inductive coil 80 to which RF power is coupled via RF generator 82 through impedance match network 84. RF power is inductively coupled from inductive coil 80 through dielectric window (not shown) to plasma processing region 45. A typical frequency for the application of RF power to the inductive coil 80 can range from about 10 MHz to about 100 MHz. Similarly, a typical frequency for the application of power to the chuck electrode can range from about 0.1 MHz to about 100 MHz. In addition, a slotted Faraday shield (not shown) can be employed to reduce capacitive coupling between the inductive coil 80 and plasma. Moreover, controller 14 is coupled to RF generator 82 and impedance match network 84 in order to control the application of power to inductive coil 80. In an alternate embodiment, inductive coil 80 can be a "spiral" coil or "pancake" coil in communication with the plasma processing region 15 from above as in a transformer coupled plasma (TCP) reactor. The design and implementation of an inductively coupled plasma (ICP) source, or transformer coupled plasma (TCP) source, is well known to those skilled in the art.

Alternately, the plasma can be formed using electron cyclotron resonance (ECR). In yet another embodiment, the plasma is formed from the launching of a Helicon wave. In yet another embodiment, the plasma is formed from a propagating surface wave. Each plasma source described above is well known to those skilled in the art.

In the following discussion, a method of etching a dielectric layer on a substrate utilizing a dry plasma etching system is presented. For example, the dry plasma etching system can comprise various elements, such as described in FIGS. 2 through 6, and combinations thereof.

In one embodiment, a method of selectively etching silicon oxide ($SiO_x$) or silicon nitride ($Si_yN_z$) or both relative to silicon, or relative to silicon and polysilicon, comprises a process chemistry having trifluoromethane ($CHF_3$), difluoromethane ($CH_2F_2$), argon (Ar), and optionally an oxygen containing gas, such as oxygen ($O_2$). For example, a process parameter space can comprise a chamber pressure of about 5 to about 1000 mTorr, a $CHF_3$ process gas flow rate ranging from about 1 to about 1000 sccm, a $CH_2F_2$ process gas flow rate ranging from about 1 to about 1000 sccm, an optional $O_2$ process gas flow rate ranging from about 1 to about 1000 sccm, an Ar process gas flow rate ranging from about 1 sccm to about 2000 sccm, an upper electrode (e.g., element 70 in FIG. 5) RF bias ranging from about 0 to about 2000 W, and a lower electrode (e.g., element 20 in FIG. 5) RF bias ranging from about 10 to about 1000 W. Also, the upper electrode bias frequency can range from about 0.1 MHz to about 200 MHz, e.g., 60 MHz. In addition, the lower electrode bias frequency can range from about 0.1 MHz to about 100 MHz, e.g., 2 MHz.

Additionally, for example, a process parameter space can comprise a chamber pressure of about 40 to about 100 mTorr, a $CHF_3$ process gas flow rate ranging from about 5 to about 100 sccm, a $CH_2F_2$ process gas flow rate ranging from about 1 to about 10 sccm, an optional $O_2$ process gas flow rate ranging from about 0 to about 10 sccm, an Ar process gas flow rate ranging from about 0 sccm to about 500 sccm, an upper electrode (e.g., element 70 in FIG. 5) RF bias ranging from about 100 to about 1000 W, and a lower electrode (e.g., element 20 in FIG. 5) RF bias ranging from about 50 to about 950 W. Also, the upper electrode bias frequency can range from about 0.1 MHz to about 200 MHz, e.g., 60 MHz. In addition, the lower electrode bias frequency can range from about 0.1 MHz to about 100 MHz, e.g., 2 MHz.

As discussed earlier, the use of a fluorohydrocarbon-based etch chemistry, in particular $CHF_3$ and $CH_2F_2$, facilitates the production of hydrocarbon and fluorocarbon molecules that may protect silicon and polysilicon surfaces while permitting the etching of silicon oxide or silicon nitride surfaces. For example, the inventor believes that, under certain conditions, $CHF_3$ tends to produce relatively more actively etching molecules or atoms, and $CH_2F_2$ tends to produce relatively more polymer forming molecules.

In one example, a method of selectively etching silicon oxide relative to silicon and polysilicon utilizing a dry plasma etching system, such as the one described in FIG. 5, is presented. However, the methods discussed are not to be limited in scope by this exemplary presentation.

As discussed above, a spacer etch process preferably uses etch chemistry to etch the dielectric material while minimizing etch of the polysilicon gate material and minimizing etch of the silicon substrate. U.S. patent application Ser. No. 11/226,452 discloses that use of $CH_2F_2$ in the etch process can improve oxide etch selectively with respect to polysilicon. However, the present inventor determined that the process disclosed in application Ser. No. 11/226,452 could not achieve a comparable improvement in the selectivity of oxide with respect to crystalline silicon, which is also desirable. Specifically, Table I presents two process recipes including a first process recipe (process A) utilizing $CHF_3$ and Ar, and a second process recipe (process B) utilizing $CHF_3$, $CH_2F_2$, $O_2$, and Ar:

TO SILICON", filed on Sep. 15, 2005, the entire contents of which are herein incorporated by reference.

Table 2 presents the etch selectivity of silicon oxide relative to polysilicon (oxide/polysilicon, ratio of silicon oxide etch rate (E/R) to polysilicon etch rate), the etch selectivity of silicon oxide relative to silicon (oxide/silicon, ratio of silicon oxide etch rate to silicon etch rate), the silicon oxide etch rate (A/min), and the amount of silicon recess (nm) in the substrate following the completion of the spacer dielectric etch. Inspection of Table 2 indicates a large increase in etch selectivity of oxide to polysilicon when utilizing the second process recipe that includes the introduction of $CH_2F_2$. However, the present inventor determined that only a marginal increase in selectivity of oxide to silicon is observed when utilizing the second process recipe. Hence, the susceptibility of the (single crystal) silicon to the etching chemistry is very different than that of the polysilicon to the etching chemistry, which may not have been well understood prior to the present invention.

TABLE 2

| PROCESS | oxide/ polysilicon | oxide/ silicon | Oxide E/R (A/min) | Silicon recess (nm) |
|---------|-------------------|----------------|-------------------|---------------------|
| A | 6.4 | 3 | 312.2 +/- 2.4% | 5 |
| B | 18.1 | 4 | 296.7 +/- 1.3% | 6 |

Figure 1B:
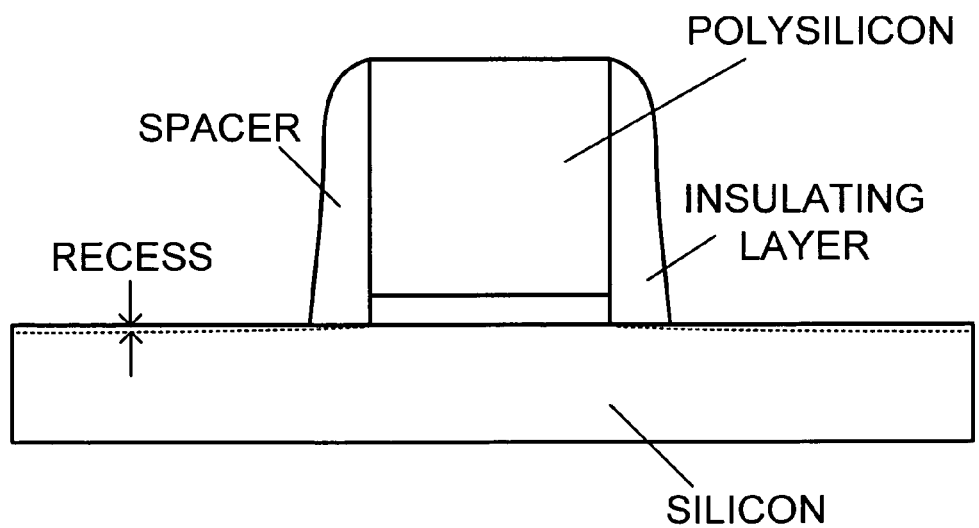

Based on the above recognition and its significance to processes such as the spacer etch process of FIGS. 1A and 1B, the present inventor conducted extensive research and testing in an attempt to identify the significance of different process

TABLE 1

| PROCESS | p (mtorr) | Gap (mm) | UEL P (W) | LEL P (W) | CHF3 (sccm) | Ar (sccm) | CH2F2 (sccm) | O2 (sccm) |
|---------|-----------|----------|-----------|-----------|-------------|-----------|--------------|-----------|
| A | 40 | 170 | 250 | 200 | 25 | 475 | 0 | 0 |
| B | 40 | 170 | 250 | 200 | 20 | 475 | 5 | 2 |

In Table 1, p represents the gas pressure in the process chamber (millitorr, mtorr), gap represents the spacing between an upper electrode (e.g., element 70 in FIG. 5) and a lower electrode (e.g., element 20 in FIG. 5) (millimeters, m), UEL P represents the radio frequency (RF) power coupled to the upper electrode (e.g., element 70 in FIG. 5) (W, watts), LEL P represents the RF power coupled to the lower electrode (e.g., element 20 in FIG. 5) (W, watts), CHF3 represents the gas flow rate of $CHF_3$ (standard cubic centimeters per minute, sccm), Ar represents the gas flow rate of Ar (sccm), CH2F2 represents the gas flow rate of $CH_2F_2$ (sccm), and O2 represents the gas flow rate of $O_2$ (sccm). In each process condition, as well as the process conditions to follow, the substrate is affixed to the substrate holder using electrostatic clamping, wherein the substrate holder comprises a two-zone backside helium supply system configured to impose 15 torr backside helium pressure at the substrate center and 25 torr backside helium pressure at the substrate edge. Additionally, the temperature of the upper electrode (e.g., element 70 in FIG. 5) is set to approximately 80 degrees C., the temperature of the walls of the dry plasma etching system are set to 60 degrees C., and the temperature of the lower electrode (element 20 in FIG. 5), or substrate holder, is set to 30 degrees C. Additional details of this process are provided in pending U.S. patent application Ser. No. 11/226,452, entitled "METHOD AND SYSTEM FOR ETCHING SILICON OXIDE AND SILICON NITRIDE WITH HIGH SELECTIVITY RELATIVE parameters illustrated in Table 1 (i.e., pressure, flow rate of argon, flow rate of $CH_2F_2$, flow rate of $CHF_3$, flow rate of $O_2$, power, etc.) on the etching of silicon oxide and silicon. In doing so, the inventor identified that, desirably, a process condition is sought having: (1) high silicon oxide etch rate, (2) low silicon etch rate, (3) acceptable process uniformity, and (4) low net deposition on silicon.

Table 3 presents the set of process conditions executed in the research and testing. In addition to the process parameters listed in Table 1, Table 3 also provides the etch rate of silicon oxide (nm/min), measured on a blanket silicon oxide substrate, the etch rate of silicon (nm/min), measured on a single crystal silicon substrate using atomic force microscopy (AFM), and the etch selectivity between the silicon oxide and the silicon (i.e., the ratio of the silicon oxide etch rate to the silicon etch rate). The measurement of change in thickness (to calculate an etch rate), either increase (net deposition) or decrease (net etch), is performed with an error of approximately plus or minus 3 nm. In some cases, data was not obtained, hence, the condition is labeled "No data", and in other cases, the etch rate is negative indicating a net deposition of material (e.g., polymer) on the silicon oxide and silicon surfaces (Polymer—oxide/silicon) or on the silicon surfaces (Polymer—silicon).

In the first sixteen (16) process conditions, no $CH_2F_2$ was added to the etching chemistry. Only the pressure, power, argon flow rate, and $O_2$ flow rate were varied.

By inspection of Table 3, the etch selectivity between silicon oxide and silicon is less than 4-to-1 for all cases. Additionally, in some cases, there exists net deposition on both silicon oxide and silicon surfaces, such as when argon is not introduced and the power is low (see process no. 12). The inventor has observed: (1) increasing the argon flow rate tends to increase the etch rate of silicon, (2) increasing the $O_2$ flow rate tends to increase the etch rate of silicon, (3) increasing the power tends to increase the etch rate of silicon, and (4) increasing the pressure tends to decrease the etch rate of silicon.

From process numbers 17 through 31, $CH_2F_2$ is introduced. Therein, the pressure, power, the flow rate of argon, and the flow rate of $CH_2F_2$ are varied. As described earlier, the inventor contemplates a balance between the power and the $CH_2F_2$ flow rate, since polymer formation is needed for protecting sidewall surfaces (i.e., anisotropic etch), yet the power must be sufficiently high to break through the polymer at the etch surfaces. The inventor further contemplates that the production of polymer forming materials in the presence of plasma is more sensitive to the $CH_2F_2$ flow rate and less sensitive to the $CHF_3$ flow rate, due to, for instance, less fluorine content in the parent molecule. This is further supported by the inventors observation that increases in $O_2$ (which typically increase etch rate) were offset by the introduction of $CH_2F_2$.

the power and flow rate of $CH_2F_2$. Thus, the present inventor has identified these parameters as particularly effective in adjusting selectivity to meet process requirements. The inventor believes the variation in power affects the production of polymer forming material by adjusting the level of dissociation of the polymer-forming parent molecule ($CH_2F_2$) (e.g., decreasing the power causes less dissociation, and increasing the power causes greater dissociation), and the variation in $CH_2F_2$ flow rate affects the production of polymer forming material by adjusting the amount of available polymer-forming parent molecule ($CH_2F_2$).

Further inspection of Table 3 indicates, for example: (A) process condition no. 21 produces a marginal silicon oxide etch rate (14.6 nm/min) with net deposition on silicon (35 nm/min); (B) process condition no. 22 produces an etch selectivity in excess of 8-to-1 with a low silicon etch rate (4 nm/min) and no net deposition on the silicon; (C) process condition no. 25 produces a high silicon oxide etch rate (46.1 nm/min); and (D) process condition no. 26 produces a high silicon oxide etch rate (56.3 nm/min) with minimal net deposition on silicon (4.5 nm/min).

Figure 8A:
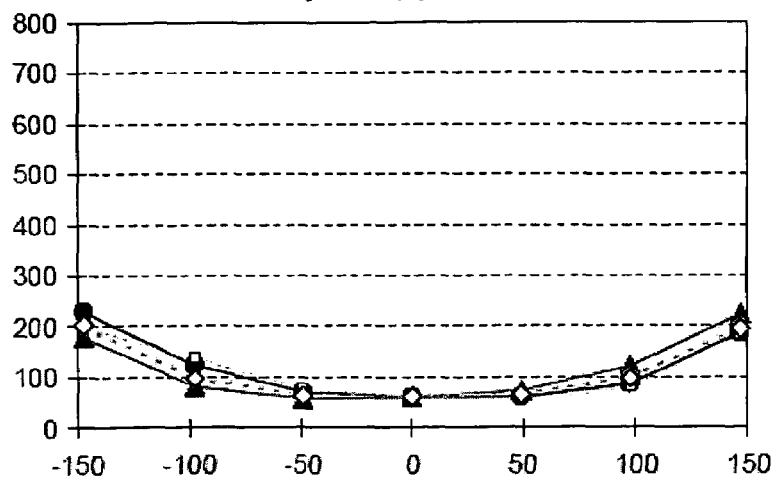
FIGS. 8A through 8D present exemplary data for etch uniformity.
Figure 8B:
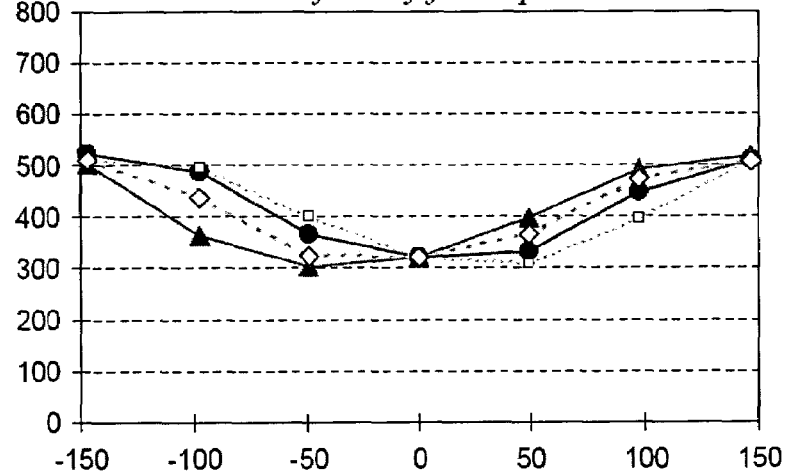

However, referring to FIGS. 8A through 8D, the silicon oxide etch uniformity varies significantly for these four process conditions. FIGS. 8A and 8B illustrate poor uniformity while excessive (and potentially excessive, in the case of process condition no. 25) polymer deposition occurs on the

TABLE 3

| PROCESS | p (mtorr) | Gap (mm) | UEL P (W) | LEL P (W) | CHF3 (sccm) | Ar (sccm) | CH2F2 (sccm) | O2 (sccm) | Oxide E/R (nm/min) | Si E/R (nm/min) | oxide/silicon |
|---|---|---|---|---|---|---|---|---|---|---|---|
| 1 | 40 | 170 | 250 | 200 | 25 | 0 | 0 | 5 | 31.7 | 16.1 | 2.0 |
| 2 | 100 | 170 | 100 | 50 | 25 | 0 | 0 | 0 | No data | No data | No data |
| 3 | 100 | 170 | 100 | 50 | 25 | 475 | 0 | 0 | 1.7 | 5 | 0.3 |
| 4 | 100 | 170 | 250 | 200 | 25 | 475 | 0 | 0 | 31.2 | 8.6 | 3.6 |
| 5 | 100 | 170 | 250 | 200 | 25 | 0 | 0 | 0 | No data | No data | No data |
| 6 | 40 | 170 | 100 | 50 | 25 | 475 | 0 | 5 | 8.2 | 15.3 | 0.5 |
| 7 | 100 | 170 | 100 | 50 | 25 | 475 | 0 | 5 | 7.6 | 13.8 | 0.6 |
| 8 | 100 | 170 | 250 | 200 | 25 | 0 | 0 | 5 | No data | No data | No data |
| 9 | 100 | 170 | 100 | 50 | 25 | 0 | 0 | 5 | No data | No data | No data |
| 10 | 40 | 170 | 100 | 50 | 25 | 0 | 0 | 5 | 8.3 | 11.5 | 0.72173913 |
| 11 | 40 | 170 | 250 | 200 | 25 | 475 | 0 | 0 | 29.2 | 10.9 | 2.678899083 |
| 12 | 40 | 170 | 100 | 50 | 25 | 0 | 0 | 0 | −15.1 | −30 | Polymer - oxide/silicon |
| 13 | 40 | 170 | 250 | 200 | 25 | 0 | 0 | 0 | 23.5 | 8.1 | 2.901234568 |
| 14 | 100 | 170 | 250 | 200 | 25 | 475 | 0 | 5 | 30.5 | 21.1 | 1.44549763 |
| 15 | 40 | 170 | 250 | 200 | 25 | 475 | 0 | 5 | 26.1 | 21.8 | 1.197247706 |
| 16 | 40 | 170 | 100 | 50 | 25 | 475 | 0 | 0 | 8.6 | 7.5 | 1.146666667 |
| 17 | 40 | 170 | 250 | 200 | 25 | 100 | 6 | 0 | −7.3 | −65 | Polymer - oxide/silicon |
| 18 | 100 | 170 | 250 | 200 | 25 | 475 | 6 | 0 | −21.1 | −53 | Polymer - oxide/silicon |
| 19 | 100 | 170 | 250 | 200 | 25 | 100 | 2 | 0 | −13.3 | −62 | Polymer - oxide/silicon |
| 20 | 40 | 170 | 250 | 200 | 25 | 475 | 2 | 0 | 28.1 | 6.7 | 4.194029851 |
| 21 | 100 | 170 | 250 | 200 | 25 | 475 | 2 | 0 | 14.6 | −35 | Polymer - silicon |
| 22 | 60 | 170 | 275 | 225 | 25 | 450 | 1.6 | 0 | 33.6 | 4 | 8.4 |
| 23 | 60 | 170 | 300 | 250 | 25 | 450 | 1.6 | 0 | 36.6 | 4.8 | 7.625 |
| 24 | 70 | 170 | 350 | 300 | 25 | 450 | 2.5 | 0 | 41.8 | No data | No data |
| 25 | 70 | 170 | 450 | 400 | 25 | 450 | 3.5 | 0 | 46.1 | No data | No data |
| 26 | 70 | 170 | 500 | 450 | 25 | 450 | 2.9 | 0 | 56.3 | −4.5 | Polymer - silicon |
| 27 | 75 | 170 | 600 | 550 | 25 | 450 | 3.3 | 0 | 63.1 | No data | No data |
| 28 | 65 | 170 | 300 | 250 | 25 | 450 | 1.8 | 0 | 35.6 | 1.1 | 32.4 |
| 29 | 60 | 170 | 275 | 225 | 25 | 450 | 1.8 | 0 | 32.3 | 2.2 | 14.7 |
| 30 | 65 | 170 | 295 | 245 | 25 | 450 | 1.9 | 0 | 34.9 | 0 | No data |
| 31 | 62 | 170 | 295 | 245 | 25 | 450 | 1.8 | 0 | 35.2 | No data | No data |

Figure 7:
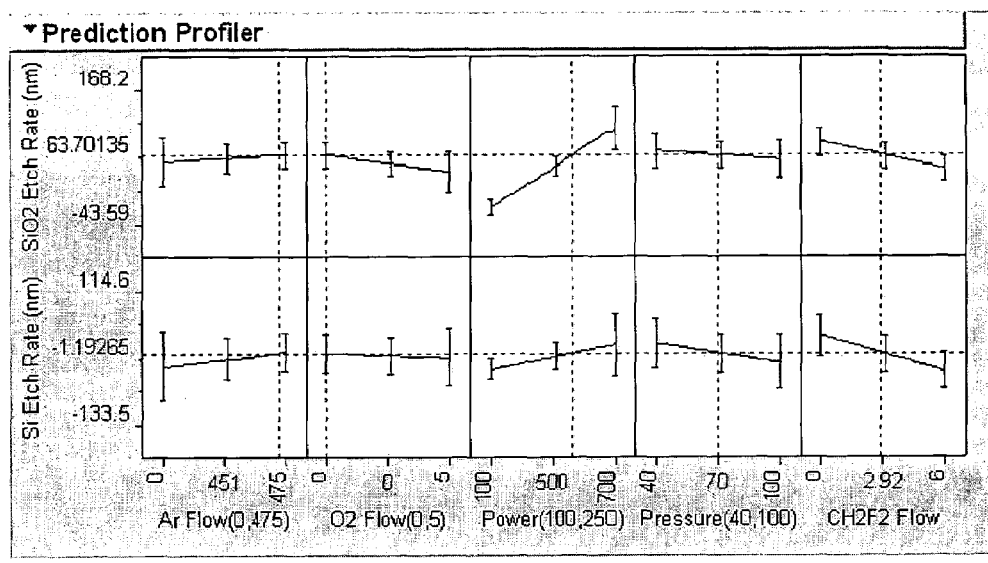
FIG. 7 presents an exemplary dependence of a silicon oxide etch rate and a silicon etch rate on several process parameters.
Figure 8C:
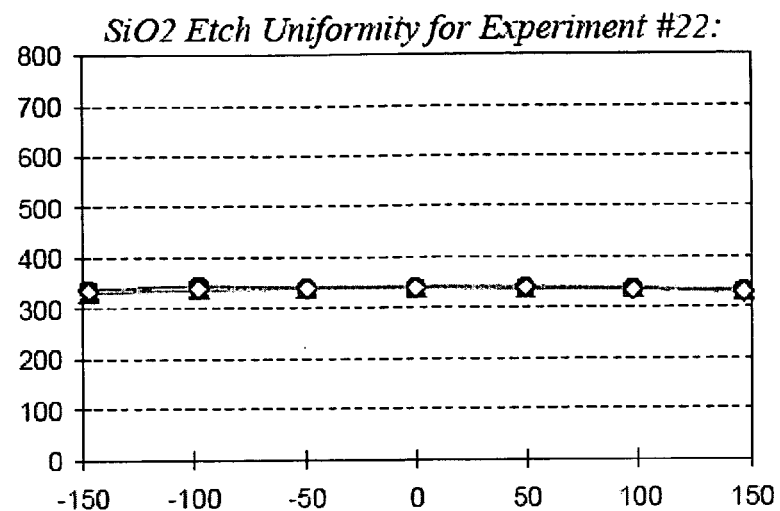
Figure 8D:
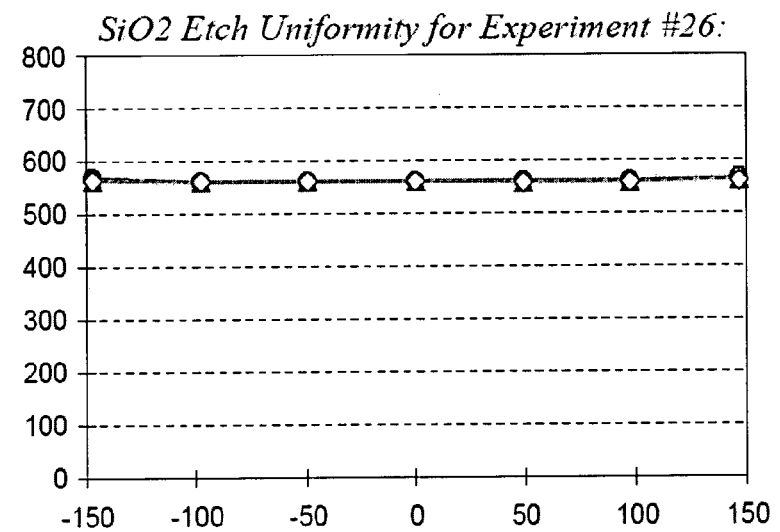

FIG. 7 presents the results of the tests performed in Table 3, and illustrates the sensitivity of the silicon oxide etch rate ($SiO_2$ etch rate, nm per one minute etch process) and the silicon etch rate (Si etch rate, nm per one minute etch process) to the variation of several parameters, including the argon flow rate, the $O_2$ flow rate, the power, the pressure, and the $CH_2F_2$ flow rate. In particular, FIG. 7 indicates greater sensitivity of the silicon oxide and silicon etch rate to variations in silicon surfaces. FIGS. 8C and 8D illustrate good uniformity with high silicon oxide etch rate and either low silicon etch rate or low net deposition on silicon.

Figure 9:
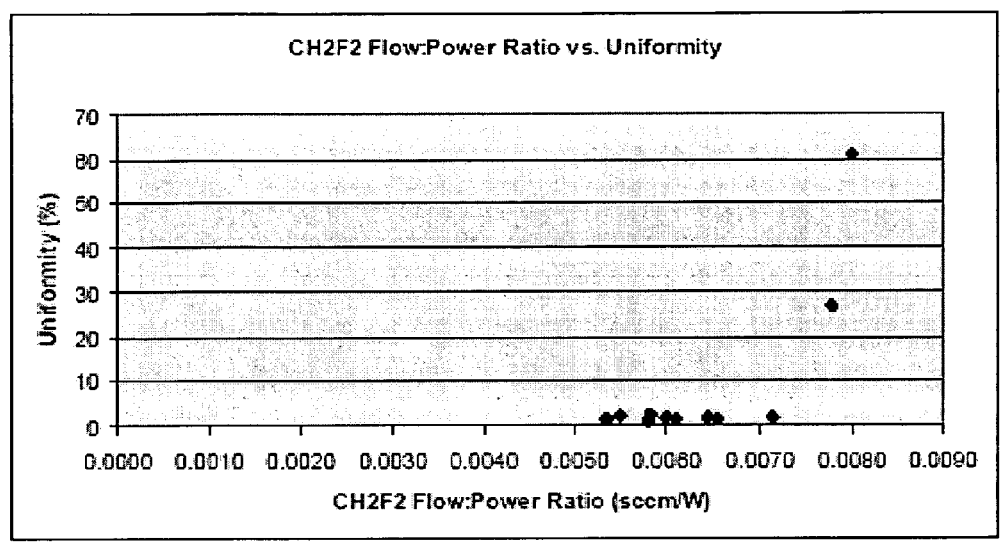
FIG. 9 present exemplary data for a dry plasma etching process.

Referring now to Table 4 and FIG. 9, the dependence of the silicon oxide etch uniformity (%) on the ratio of the flow rate of $CH_2F_2$ (sccm) to power (W) is illustrated. At a ratio of approximately 0.0071 and less, the etch uniformity is less than approximately 2.5%. However, for ratios greater than approximately 0.0071, the uniformity significantly worsens. The inventor believes that the uniformity becomes poor as a result of over-production of polymer forming molecules, i.e., excessive amount of polymer forming parent molecules (CH$_2$F$_2$), or low power (e.g., low dissociation), or both. Thus, the present inventor has further discovered that, where uniformity of oxide etch is an important process consideration, the ratio of power to CH$_2$F$_2$ flow rate can be adjusted to meet process requirements.

Figure 10:
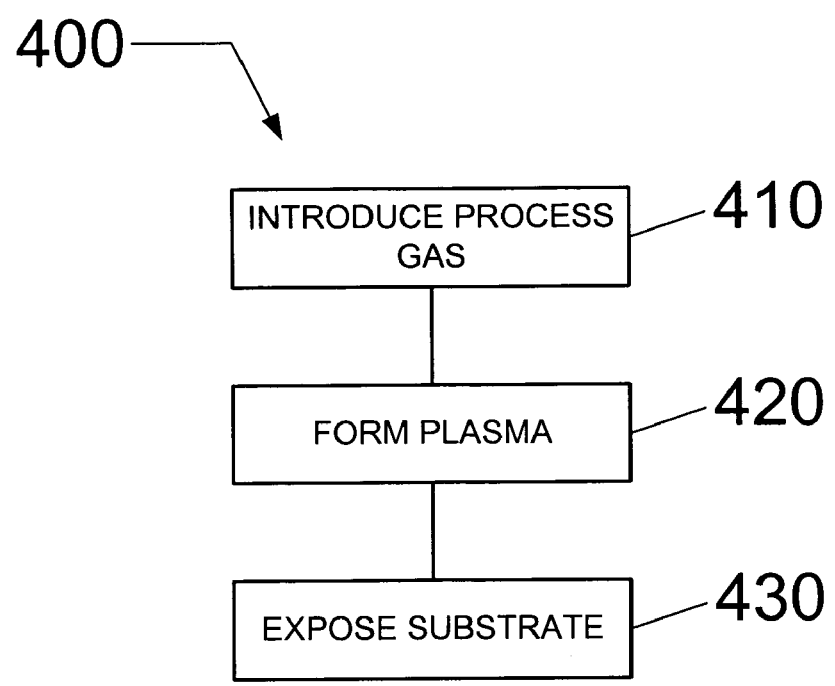
FIG. 10 presents a method of etching a dielectric layer according to an embodiment of the present invention.

FIG. 10 presents a flow chart of a method for selectively etching a dielectric such as silicon oxide or silicon nitride or both relative to silicon on a substrate in a plasma processing system according to an embodiment of the present invention. Procedure 400 begins in 410 in which a process gas is introduced to the dry plasma etching system, wherein the process gas comprises trifluoromethane (CHF$_3$), difluoromethane (CH$_2$F$_2$), and an inert gas, such as a noble gas (e.g., argon). Alternately, the process gas can further comprise an oxygen containing gas.

TABLE 4

| PROCESS | Uniformity (%) | Power (W) | CH2F2 (sccm) | Ratio (sccm/W) |
|---|---|---|---|---|
| 21 | 61.1 | 250 | 2 | 0.008 |
| 22 | 2.4 | 275 | 1.6 | 0.0058 |
| 23 | 1.5 | 300 | 1.6 | 0.0053 |
| 24 | 1.9 | 350 | 2.5 | 0.0071 |
| 25 | 26.8 | 450 | 3.5 | 0.0078 |
| 26 | 1.2 | 500 | 2.9 | 0.0058 |
| 27 | 2 | 600 | 3.3 | 0.0055 |
| 28 | 1.7 | 300 | 1.8 | 0.006 |
| 29 | 1.4 | 275 | 1.8 | 0.0065 |
| 30 | 1.8 | 295 | 1.9 | 0.0064 |
| 31 | 1.4 | 295 | 1.8 | 0.0061 |

In 420, plasma is formed in the dry plasma etching system from the process gas using, for example, any one of the systems described in FIGS. 2 through 6, and combinations thereof.

In 430, the substrate is exposed to the plasma formed in 420 in order to etch silicon oxide or silicon nitride or both with high etch selectivity to silicon.

Figure 11:
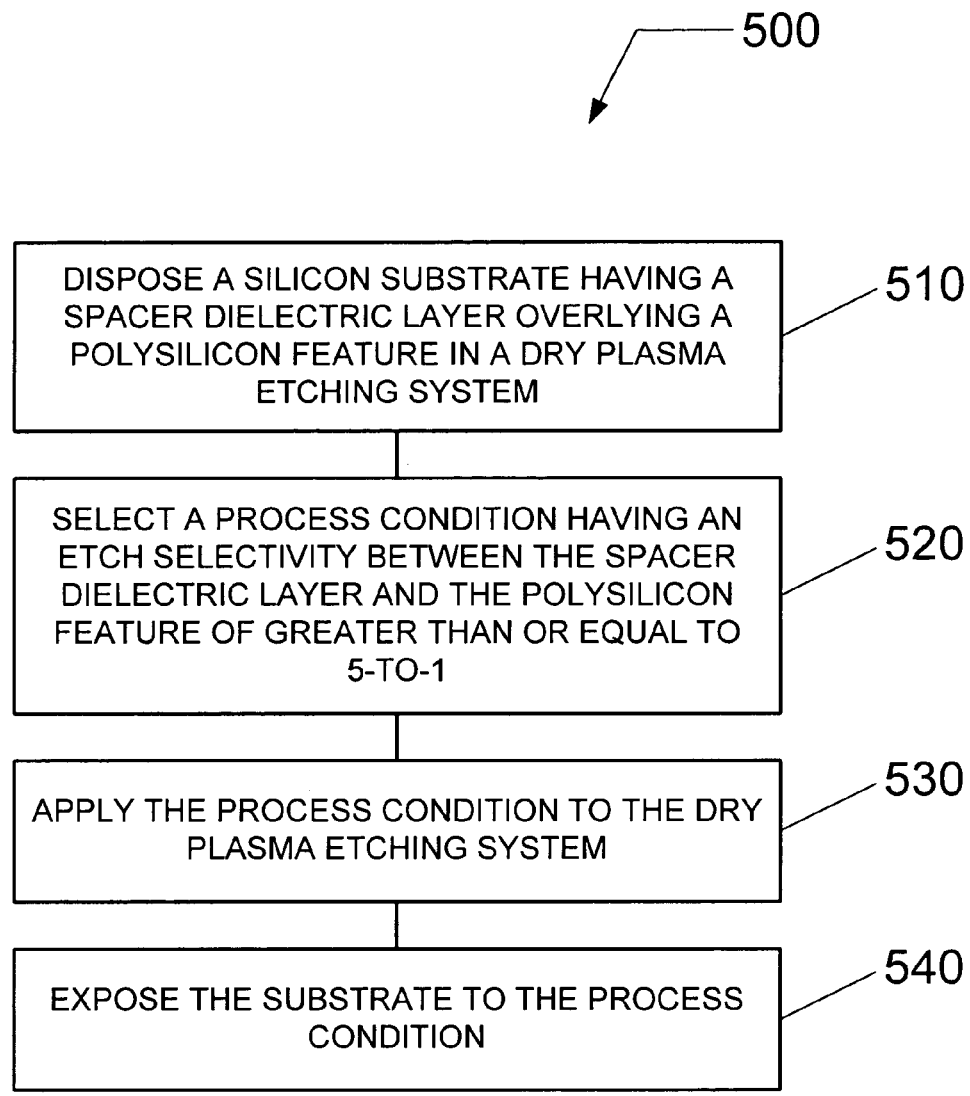
FIG. 11 presents a method of etching a dielectric layer according to another embodiment of the present invention.

FIG. 11 presents a flow chart of a method for reducing a recess in a spacer etch process. The flow chart 500 begins in 510 with disposing a silicon substrate having a spacer dielectric layer overlying a polysilicon feature on a substrate holder in a dry plasma etching system. The dry plasma etching system can, for example, be any one of the systems described in FIGS. 2 through 6, and combinations thereof. The spacer dielectric layer can comprise silicon oxide (SiO$_x$), or silicon nitride (Si$_y$N$_z$), or a combination thereof, such as a silicon oxynitride layer.

In 520, a process condition is selected to have an etch selectivity between the spacer dielectric layer and the silicon substrate of greater than or equal to approximately 5-to-1. At least one of the flow rate of CH$_2$F$_2$, or the flow rate of CHF$_3$, or the pressure, or the RF power coupled to an electrode in the dry plasma etching system (e.g., the RF power coupled to upper electrode 70), or any combination of two or more thereof are varied to produce an etch selectivity of spacer dielectric layer to silicon of 5-to-1 or greater, and desirably 7-to-1 or greater.

In 530, the selected process condition is applied to the dry plasma etching system and, in 540, the substrate is exposed to the process condition. One example of the process condition can include: a chamber pressure of about 60 mTorr, a CHF$_3$ process gas flow rate of about 25 sccm, a CH$_2$F$_2$ process gas flow rate of about 1.6 sccm, an Ar process gas flow rate of about 450 sccm, an upper electrode (e.g., element 70 in FIG. 5) RF bias of about 275 W, and a lower electrode (e.g., element 20 in FIG. 5) RF bias of about 225 W. Also, the upper electrode bias frequency can range from about 0.1 MHz to about 200 MHz, e.g., 60 MHz. In addition, the lower electrode bias frequency can range from about 0.1 MHz to about 100 MHz, e.g., 2 MHz.

Figure 12:
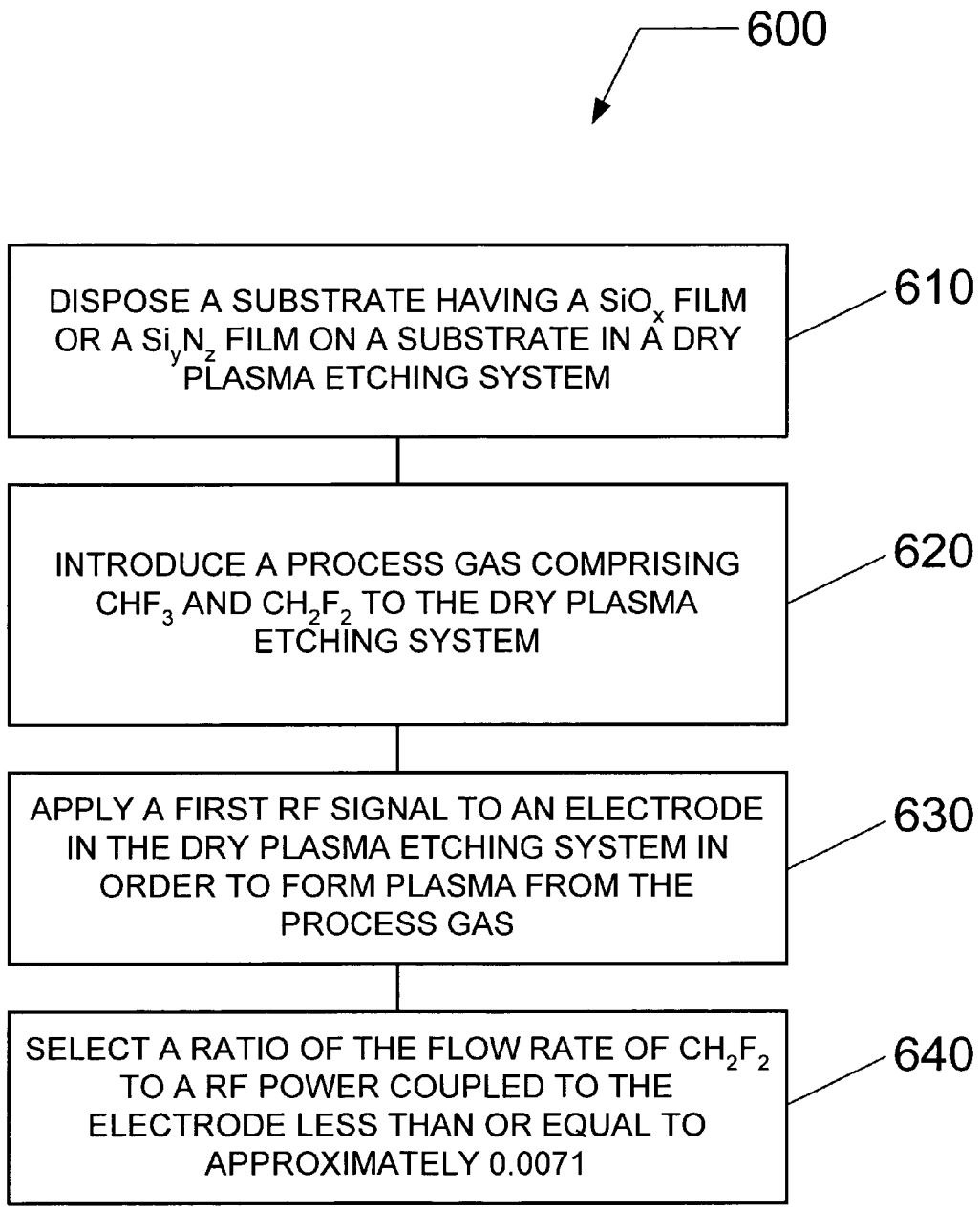
FIG. 12 presents a method of reducing a recess on a substrate according to another embodiment of the present invention.

FIG. 12 presents a flow chart of a method for uniformly etching a dielectric layer relative to silicon on a substrate in a dry plasma etching system. The flow chart 600 begins in 510 with disposing a substrate having a dielectric layer, such as a silicon oxide (SiO$_x$) or silicon nitride (Si$_y$N$_z$) film, on a substrate holder in the dry plasma etching system. The silicon oxide (SiO$_x$) or silicon nitride (Si$_y$N$_z$) film can include a spacer dielectric layer overlying a polysilicon feature on the substrate. The dry plasma etching system can, for example, be any one of the systems described in FIGS. 2 through 6, and combinations thereof.

In 620, a process gas comprising CHF$_3$ and CH$_2$F$_2$ is introduced to the dry plasma etching system. The process gas can further comprise an inert gas, such as a noble gas (e.g., argon). Additionally, the process gas can comprise an oxygen containing gas, such as oxygen (O$_2$), NO, N$_2$O, NO$_2$, CO, or CO$_2$, or any combination of two or more thereof.

In 630, a first radio frequency (RF) signal is applied to an electrode in the dry plasma etching system in order to form plasma from the process gas. For example, the electrode can include an upper electrode (e.g., element 70 in FIG. 5) opposing the substrate on the substrate holder. The first RF signal can be at a first RF frequency, and the first RF frequency can be greater than or equal to 20 MHz. Furthermore, a second RF signal can be applied to the same electrode or another electrode in the dry plasma etching system. For example, the second RF signal can be applied to the substrate holder upon which the substrate rests. The second RF frequency can be at a second RF frequency, and the second RF frequency can be less than or equal to 20 MHz.

In 640, a ratio of the flow rate of CH$_2$F$_2$ to a RF power coupled to an electrode in the dry plasma etching system is selected to be equal to or less than approximately 0.0071.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

What is claimed is:

1. A method of reducing a recess in a spacer etch process, comprising:
   disposing a silicon substrate having a spacer dielectric layer overlying a polysilicon feature and a single-crystal-silicon surface on a substrate holder in a dry plasma etching system;
   selecting a process condition to have an etch selectivity between said spacer dielectric layer and said single-crystal-silicon surface of greater than or equal to approximately 5-to-1, comprising:
      setting a pressure in said dry plasma etching system;
      introducing a process gas comprising a first flow rate of a noble gas, a second flow rate of CHF$_3$, and a third flow rate of CH$_2$F$_2$; and
      setting a power to be coupled to an electrode in said dry plasma etching system to form plasma from said process gas;

applying said process condition to said dry plasma etching system; and exposing said substrate to said process condition to etch said spacer dielectric layer down to the single-crystal-silicon surface while minimizing a recess formed in said single-crystal-silicon surface.

2. The method of claim 1, wherein said disposing said silicon substrate in said dry plasma etching system comprises disposing a silicon substrate having a silicon dioxide ($SiO_2$) layer overlying a polysilicon feature.

3. The method of claim 2, wherein said selecting said process condition comprises selecting a process condition to achieve an etch selectivity between said spacer dielectric layer and said silicon substrate greater than approximately 7-to-1.

4. The method of claim 2, wherein said setting said pressure comprises setting a pressure ranging from approximately 5 mtorr to approximately 1000 mtorr.

5. The method of claim 2, wherein said setting said pressure comprises setting a pressure ranging from approximately 40 mtorr to approximately 100 mtorr.

6. The method of claim 2, wherein said setting said first flow rate comprises setting a flow rate of argon ranging from approximately 0 sccm to approximately 500 sccm.

7. The method of claim 2, wherein said setting said second flow rate comprises setting a flow rate of $CHF_3$ ranging from approximately 1 sccm to approximately 1000 sccm.

8. The method of claim 2, wherein said setting said second flow rate comprises setting a flow rate of $CHF_3$ ranging from approximately 20 sccm to approximately 50 sccm.

9. The method of claim 2, wherein said setting said second flow rate comprises setting a flow rate of $CH_2F_2$ ranging from approximately 1 sccm to approximately 1000 sccm.

10. The method of claim 2, wherein said setting said second flow rate comprises setting a flow rate of $CH_2F_2$ ranging from approximately 2 sccm to approximately 6 sccm.

11. The method of claim 2, wherein said setting said power comprises setting a radio frequency (RF) power to be coupled to an upper electrode, opposing said substrate on said substrate holder, at a first frequency.

12. The method of claim 11, wherein said setting said RF power to said upper electrode comprises setting a power ranging from approximately 0 W to approximately 2000 W.

13. The method of claim 11, wherein said setting said RF power to said upper electrode comprises setting a power ranging from approximately 100 W to approximately 1000 W.

14. The method of claim 2, wherein said setting said power comprises setting a first radio frequency (RF) power to be coupled to an upper electrode, opposing said substrate on said substrate holder, at a first RF frequency, and setting a second RF power to be coupled to said substrate holder at a second RF frequency.

15. The method of claim 14, wherein said setting said first RF power comprises setting a power ranging from approximately 100 W to approximately 1000 W, and said setting said second RF power comprises setting a power ranging from approximately 50 W to approximately 950 W.

16. A method of uniformly etching silicon oxide relative to at least one of single-crystal-silicon or polysilicon on a substrate placed in a dry plasma etching system, comprising:

placing said substrate having said silicon oxide ($SiO_x$) film overlying said at least one of single-crystal-silicon or polysilicon on a substrate holder in said dry plasma etching system;

introducing a reactive process gas to a process space in said dry plasma etching system, said reactive process gas comprising $CH_2F_2$ and $CHF_3$;

applying a first radio frequency (RF) signal to an electrode in said dry plasma etching system, wherein said first RF signal comprises a frequency greater than 20 MHz;

selecting a ratio of a flow rate of said $CH_2F_2$ to a RF power coupled to said electrode that is substantially equal to or less than a value of 0.0071 sccm per Watt; and etching said silicon oxide film down to said at least one of single-crystal-silicon or polysilicon while minimizing etching of the at least one of single-crystal-silicon or polysilicon.

17. The method of claim 16, further comprising:
applying a second RF signal to said substrate holder, wherein said second RF signal comprises a frequency less than 20 MHz.

18. The method of claim 16, further comprising:
introducing a Noble gas to said process space in said plasma processing system.

19. The method of claim 16, wherein said electrode comprises an upper electrode opposing said substrate on said substrate holder.

20. The method of claim 16, wherein said electrode comprises said substrate holder.

21. The method of claim 16, further comprising:
introducing an oxygen containing gas, wherein said oxygen containing gas comprises oxygen ($O_2$), CO, or $CO_2$, or any combination thereof.

22. The method of claim 16, wherein said silicon oxide film or said film overlie a polysilicon feature.comprises a polysilicon gate for a transistor.

23. The method of claim 22, wherein said polysilicon feature comprises a polysilicon gate, and said silicon oxide layer comprises an insulation spacer for said polysilicon gate.

* * * * *

UNITED STATES PATENT AND TRADEMARK OFFICE
CERTIFICATE OF CORRECTION

PATENT NO.       : 7,393,788 B2                                    Page 1 of 1
APPLICATION NO.  : 11/350765
DATED            : July 1, 2008
INVENTOR(S)      : Cook It is certified that error appears in the above-identified patent and that said Letters Patent is hereby corrected as shown below:

On the title page, Item (76), the Inventor address is incorrect. Item (76) should read:

-- (76)  Inventor:  Julie A. Cook, 9 Jones Dr., Newburyport, MA (US) 01950 --

Signed and Sealed this

Ninth Day of September, 2008

JON W. DUDAS
*Director of the United States Patent and Trademark Office*